(12) United States Patent
Ma et al.

(10) Patent No.: US 7,979,814 B1
(45) Date of Patent: Jul. 12, 2011

(54) MODEL IMPLEMENTATION ON GPU

(75) Inventors: Yutao Ma, San Jose, CA (US); Yi Xu, Cupertino, CA (US)

(73) Assignee: ProPlus Design Solutions, Inc., San Jose, CA (US)

( * ) Notice: Subject to any disclaimer, the term of this patent is extended or adjusted under 35 U.S.C. 154(b) by 165 days.

(21) Appl. No.: 12/047,222

(22) Filed: Mar. 12, 2008

Related U.S. Application Data (60) Provisional application No. 60/977,958, filed on Oct. 5, 2007, provisional application No. 60/894,281, filed on Mar. 12, 2007.

(51) Int. Cl.
*G06F 17/50* (2006.01)
(52) U.S. Cl. .............................................. 716/100
(58) Field of Classification Search ............... 716/1, 5, 716/100
See application file for complete search history.

(56) References Cited

U.S. PATENT DOCUMENTS

| | | | | |
|---|---|---|---|---|
| 7,489,318 B1* | 2/2009 | Wilt | | 345/582 |
| 7,594,095 B1* | 9/2009 | Nordquist | | 712/22 |
| 2003/0105620 A1* | 6/2003 | Bowen | | 703/22 |
| 2004/0061700 A1* | 4/2004 | Shioya | | 345/426 |
| 2005/0212811 A1* | 9/2005 | Hashima et al. | | 345/582 |
| 2006/0087516 A1* | 4/2006 | Ungar | | 345/582 |
| 2007/0195085 A1* | 8/2007 | Farinelli | | 345/421 |
| 2008/0235316 A1* | 9/2008 | Du et al. | | 708/513 |
| 2010/0118043 A1* | 5/2010 | Minkin et al. | | 345/582 |
| 2010/0138376 A1* | 6/2010 | Avis et al. | | 706/50 |

* cited by examiner

*Primary Examiner* — Jack Chiang
*Assistant Examiner* — Suchin Parihar (57) ABSTRACT

Model evaluation and circuit simulation/verification is performed in a graphical processing unit (GPU). A multitude of first texture data corresponding to size parameters of devices are stored. A multitude of second texture data corresponding to instance parameters of the devices are stored. A multitude of third texture data corresponding to models of the devices are stored. A multitude of fourth texture data corresponding to terminal voltages received by the device are stored. A multitude of links linking each device instance to an associated device model, size parameters and instance parameters are stored. A quad having a size defined by the multitude of links is drawn by the quad in the GPU. Each thread in the quad is assigned to a different one of the multitude of links. The computations are carried out in each thread using the linked data to perform the model evaluation.

17 Claims, 7 Drawing Sheets

| Link[1] | Link[2] | ... | Link[i] |
| Link[i+1] | Link[i+2] | ... | Link[i+i] |
| ... | | | |
| Link[(j−i+1)] | Link[j−i+2] | ... | Link[j] |

*FIG. 2D*

| ModelIndex | InstIndex | SizeIndex | Dummy |

*FIG. 2E*

| Solution[1] | Solution[2] | ... | Solution[i] |
| Solution[i+1] | Solution[i+2] | ... | Solution[i+i] |
| ... | | | |
| Solution[(j−i+1)] | Solution[j−i+2] | ... | Solution[j] |

*FIG. 2F*

| Pixel[1] | Pixel[2] | ... | Pixel[i] |
| Pixel[i+1] | Pixel[i+2] | ... | Pixel[i+i] |
| ... | | | |
| Pixel[(j−i+1)] | Pixel[j−i+2] | ... | Pixel[j] |

*FIG. 2G*

| Instoutput[1] | Instoutput[2] | ... | Instoutput[i] |
|---|---|---|---|
| Instoutput | Instoutput[i+2] | ... | Instoutput |
| | | ... | |
| Instoutput[(j– | Instoutput[j– | ... | Instoutput[j] |

*FIG. 3A*

| Pointer[1] | Pointer[2] | ... | Pointer[m] |
|---|---|---|---|
| Pointer[m+1] | Pointer | ... | Pointer |
| | | ... | |
| Pointer[(n– | Pointer[n– | ... | Pointer[n] |

*FIG. 3B*

| Pixel[1] | Pixel[2] | ... | Pixel[m] |
|---|---|---|---|
| Pixel[m+1] | Pixel[m+2] | ... | Pixel[m+m] |
| | | ... | |
| Pixel[(n–m+1] | Pixel[n–m+2] | ... | Pixel[n] |

*FIG. 3C*

| O1ForP1 | O2ForP1 | ... | OiForP1 |
|---|---|---|---|
| O1ForP2 | O2ForP2 | ... | OjForPj |
| | | ... | |
| ... | ... | ... | OmForPn |

*FIG. 4A*

| Index[1] | Index[2] | ... | Index[m] |
|---|---|---|---|
| Index[m+1] | Index[m+2] | ... | Index[m+m] |
| | | ... | |
| Index[(n−m+1)] | Index[n−m+2] | ... | Index[n] |

*FIG. 4B*

| Num[1] | Num[2] | ... | Num[m] |
|---|---|---|---|
| Num[m+1] | Num[m+2] | ... | Num[m+m] |
| | | ... | |
| Num[(n−m+1)] | Num[n−m+2] | ... | Num[n] |

MODEL IMPLEMENTATION ON GPU

CROSS-REFERENCES TO RELATED APPLICATIONS

The present application claims benefit under 35 USC 119(e) of U.S. provisional application No. 60/894,281, entitled "Model Implementation on GPU", filed on Mar. 12, 2007, and U.S. provisional application No. 60/977,958, filed on Oct. 5, 2007, entitled "Algorithm and Implementation of Parallel Model Evaluation in GPU for Circuit Simulation", the contents of both of which applications are incorporated herein by reference in their entirety.

BACKGROUND OF THE INVENTION

The present invention relates to electronic design automation (EDA) software, and more particularly, to implementing such software in a graphical processing unit.

Integrated circuits continue to advance rapidly and are being widely used in many applications such as computers, consumer electronics, networking, and telecommunications. There are many types of integrated circuits including microprocessors, microcontrollers, application specific integrated circuits (ASICs), gate arrays, programmable logic devices (PLDs), field programmable gate arrays (FPGAs), dynamic random access memories (DRAMs), static random access memories (SRAMs), erasable programmable read only memories (EPROMs), electrically erasable programmable read only memories (EEPROMs), and Flash memories.

Design automation tools are needed to simplify and expedite the task of designing an integrated circuit. It is important to be able to accurately predict and estimate the performance of an integrated circuit before the integrated circuit is fabricated. Techniques are needed to provide accurate, fast estimates of the performance of an integrated circuit. It is often desirable in the microelectronics industry to be able to implement physical solutions in as little time as possible for coping with new market opportunities and/or emerging problems. Computer-aided simulations are often used to predict the behaviors of the electrical circuits before they are manufactured. This is done so that design errors are corrected and design parameters are optimized prior to production. It is well known, for example, to use computers and software simulators such as SPICE for obtaining fairly accurate predictions of the analog behaviors of complex circuitry. A number of logic design tools are also commercially available.

In conventional systems, computations required by circuit/logic design automation tools are implemented by one or more central processing units (CPUs). However, as model evaluation times continue to dominate the total simulation time for most Integrated circuit designs, improved systems for performing the required computations are needed.

BRIEF SUMMARY OF THE INVENTION

A method, in accordance with one embodiment of the present invention, includes a number of steps adapted to perform model evaluation in a graphical processing unit (GPU). A multitude of first texture data corresponding to size parameters of devices are stored. A multitude of second texture data corresponding to instance parameters of the devices are stored. A multitude of third texture data corresponding to models of the devices are stored. A multitude of fourth texture data corresponding to terminal voltages received by the device are stored. A multitude of links linking each device instance to an associated device model, size parameters and instance parameters are stored. A quad having a size defined by the multitude of links is drawn by the quad in the GPU. Each thread in the quad is assigned to a different one of the multitude of links. The computations are carried out in each thread using the linked data to perform the model evaluation.

In one embodiment, the first, second, third and fourth multitude of texture data are received from a CPU. In one embodiment, the GPU stamps its output data by converting the output data of the GPU from a device instance based format to a matrix pointer based format. In one embodiment, the GPU output data has a format defined by device instances. IN one embodiment, the stamped data are transferred to the CPU.

In one embodiment, double precision emulation is performed in the GPU to achieve double precision floating point accuracy. In another embodiment, the operation between the GPU and the CPU is switched to achieve double precision floating point accuracy. In one embodiment, the model evaluation is divided into a multitude of model evaluation parts to avoid GPU shader length limit. Each model evaluation part is assigned to a different GPU kernel. In one embodiment, model evaluation parts include, in part, current-voltage model evaluation part, capacitance-voltage model evaluation part, and junction evaluation part.

In accordance with another embodiment of the present invention, a system adapted to perform model evaluation during a design or verification of an integrated circuit, includes, in part, a central processing unit (CPU) and a graphical processing unit (GPU). In one embodiment, the CPU is adapted to (i) store a multitude of first texture data corresponding to device size parameters; (ii) store a multitude of second texture data corresponding to device instance parameters; (iii) store a multitude of third texture data corresponding to models of the devices; (iv) store a multitude of fourth texture data corresponding to terminal voltages received by the devices; and (v) store a multitude of links linking each device instance to an associated device model, size parameters and instance parameters. In one embodiment, the GPU is adapted to (i) draw a quad having a size defined by the number of the multitude of links; (ii) assign each thread in the quad to a different one of the multitude of links; and (iii) to carry out computations in each thread using the linked data to perform the model evaluation.

In one embodiment, the GPU is further adapted to stamp its output data by convert its output data from a device instance based format to a matrix pointer based format. In one embodiment, the GPU output data has a format defined by the device instances. In one embodiment, the GPU is further adapted to perform double precision emulation to achieve double precision floating point accuracy. In another embodiment, a control logic is adapted to switch model evaluation operation between the GPU and the CPU to achieve double precision floating point accuracy. In one embodiment, the GPU is further adapted to divide the model evaluation operation into a multitude of model evaluation parts so as to avoid GPU shader length limit and to assign each model evaluation part to a different one of the GPU kernels. In one embodiment, the multitude of model evaluation parts includes current-voltage model evaluation part, capacitance-voltage model evaluation part, and junction evaluation part.

DETAILED DESCRIPTION OF THE INVENTION

In accordance with one embodiment of the present invention, model evaluations and simulations associated with design of integrated circuits are carried out by a graphical processing unit (GPU). In accordance with a first exemplary embodiment, the GPU is used as an independent model engine controlled by a central processing unit (CPU). In such embodiments, the following steps are performed:
1. Pack CPU data to format suitable for GPU evaluation
2. Transfer CPU data into GP
3. Launch kernel evaluation to do the evaluation in GPU
4. Launch kernel evaluation to do stamping in GPU (optional)
5. transfer data from GPU to CPU
6. Convert data from GPU format to CPU format, or stamping the data into matrix in CPU directly In accordance with a second exemplary embodiment, model evaluations are treated as a part of the GPU simulation flow. Accordingly, in these embodiments, the model evaluation results are not transferred back to the CPU. Below are the steps performed in accordance with such embodiments:
1. Pack CPU data to format suitable for GPU evaluation
2. Transfer CPU data into GPU
3. Launch kernel evaluation to do the evaluation in GPU
4. Launch kernel evaluation to do stamping in GPU It is seen that the steps performed by the second exemplary embodiment are a subset of those performed by the first exemplary embodiment. Accordingly, the following is a description of the GPU model evaluation of the first exemplary embodiment.

Figure 1:
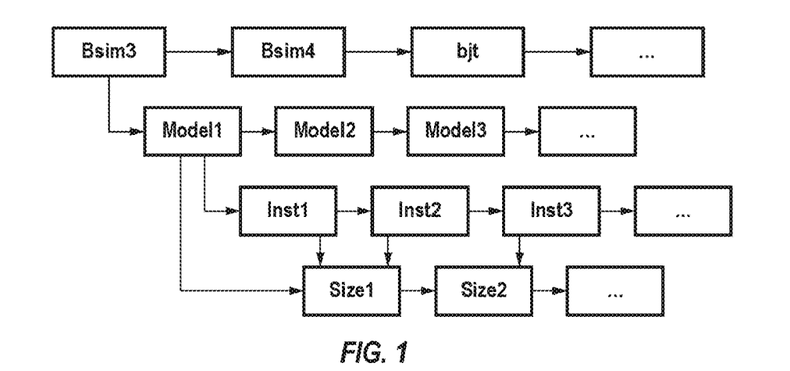
FIG. 1 shows model evaluation data that is organized as a linked list for use by a CPU, as known in the prior art.

In CPU, data used in model evaluation are usually organized as a linked list for model, instance data structures, sizes, etc., as shown in FIG. 1. In FIG. 1, Bsim3, Bsim4, are different device models for MOSFET transistors, and BJT is a device model for bipolar transistors. Each model includes a set of equations that describe the electrical characteristics of that transistor using a particular set of model parameters values (model card).

As shown in FIG. 1, each of those models point to a link list of model cards. For example, shown as being associated with model Bsin3, are models Model1, Model2, Model3, etc. As is known, a model card is a group of model parameter used to define a model behavior. Each model card, applies to one or more instances of a component. For example, model card Models 1 is shown as being applicable to instances inst1, inst2, inst3, etc. of a component. Each instance in FIG. 1 may be a MOSFET component used in the circuit being simulated for design. Some of the instances, such as instances inst1 and inst2, have same feature sizes (such as channel length and channel width), and thus share a subset of parameters, stored in size parameter structure, Size1 of FIG. 1. The size structure is used to save memory, since multiple instance share one size structure. Instance inst 3 is shown as having a feature size Size2.

Figure 2A:
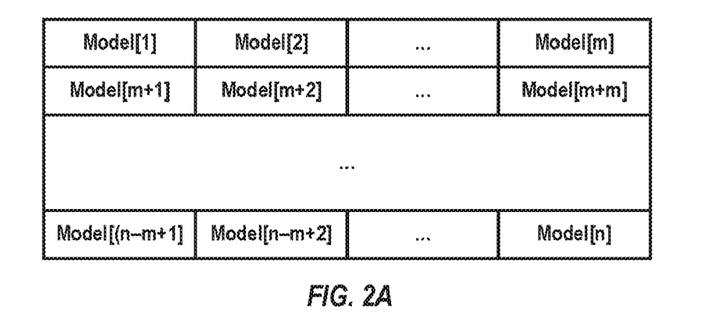
FIGS. 2A-2G show various 2D texture data structure for use by a GPU to perform model evaluation/simulation/verification, in accordance with one embodiment of the present invention.
Figure 2B:
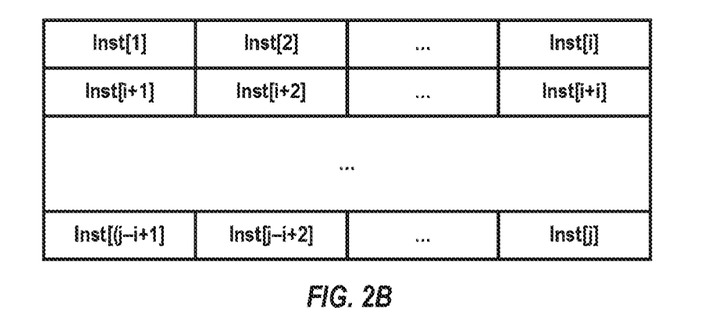
Figure 2C:
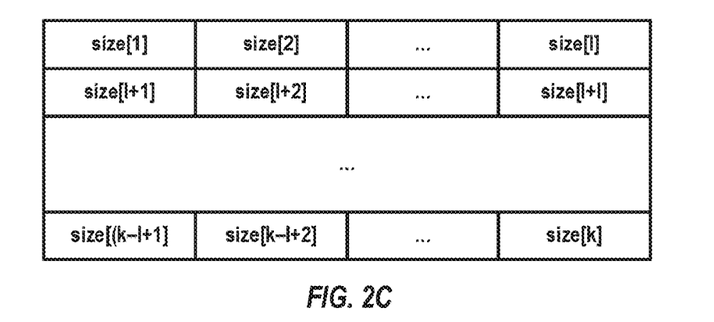
Figure 2D:
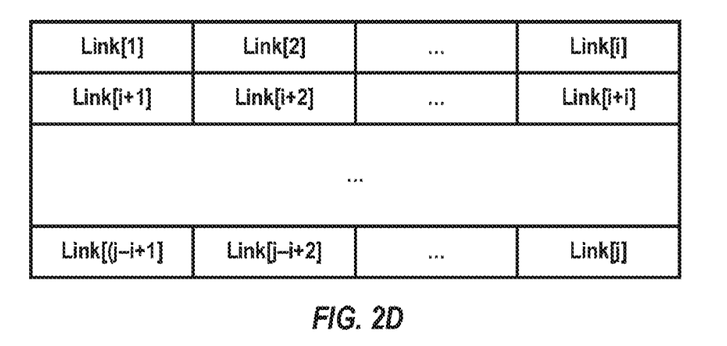
Figure 2E:
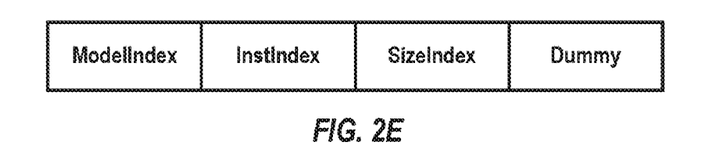

To pack the CPU compatible data to a format suitable for GPU evaluation, the link list structure of FIG. 1 is converted to 2D texture data structure, as shown in FIGS. 2A-2G. Accordingly, FIGS. 2A-2D show the data that is received and used by the GPU. FIG. 2A shows the 2D texture model data used in a GPU. FIG. 2B shows the 2D texture instance parameter values used in the GPU. FIG. 2C shows the 2D texture size parameter values used in the GPU. Each block of data in FIG. 2A represents a model. For example, Model[1] of FIG. 2A is associated with model card Model1 of FIG. 1, and Model[2] of FIG. 2A is associated with model card Model2 of FIG. 1. In one embodiment, the model parameters in each model, for example, model1, occupy a continuous segment of the memory Each entry in FIG. 2D represents a link associating an instance to the models and parameter sizes used for that instance. Each link entry, such as Link[1], includes 3 integer, namely a model index, an instance index, and a size index. FIG. 2E shows the indices associated with each link entry of FIG. 2D. Each index in FIG. 2E points to a starting point in either a model, an instance, or a parameter size. Using these indices as the starting point and the link entry in FIG. 2D, the GPU receives the texture locations where the model parameters, instance parameters and size parameters are stored, thus enabling the GPU to start model evaluation. In a GPU texture, two different data types may be used to store the data, namely Float and Float4. One floating point number may be used when using Float data type. Four floating numbers may be used when using Float4 data type. In the exemplary embodiment described herein, Float4 data type is used to store the data. For example, each entry in FIG. 2E is a Float4 data type, including 4 floating point numbers: namely the model index, instance index, size parameter index, and a dummy To launch kernel evaluation to do the evaluation in GPU, a quad is drawn in the GPU covering the same size as the link entry data structure shown in FIG. 2D. Each link entry is assigned to a thread in the GPU. From the thread coordinates, the link entry can be accessed from the texture data containing the information of the link entries. Each entry in FIG. 2D includes 3 numbers that are shown in FIG. 2E, and that are used by associated the thread to access further parameters. One of the 3 numbers is shown as ModelIndex, which the GPU thread uses to locate the position of the model used for this instance from FIG. 2A. The second of the 3 numbers in FIG. 2E is InstIndex, and that is used by the GPU thread to locate the position of the instance parameters from FIG. 2B. The third of the 3 numbers in FIG. 2E is SizeIndex, which is used to locate the size parameters of the instance from FIG.

Figure 2F:
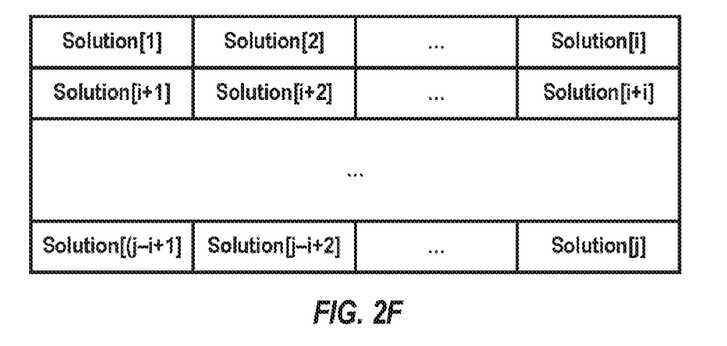
Figure 2G:
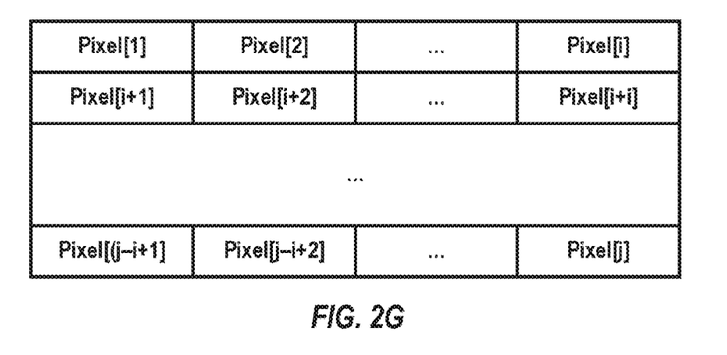

2C. Thereafter, another 3 texture data are accessed based on the index information, to get the model data, instance data and parameter size data for that instance. These data are then used by the kernel of GPU for model evaluation. The pixels associated with the coordinates of the quad drawn by the GPU are supplied by the CPU to the GPU. FIG. 2G shows pixel coordinates of such a quad. These pixels have a one-to-one relation to the links shown in FIG. 2D. The pixel coordinates ate thus used to locate the associated links entries, as shown in FIG. 2D. The GPU assigns a thread to each pixel.

In order to start model evaluation in GPU, the terminal voltages for each instance are required. Model parameters, instance parameters and size parameters are all static, i.e., their values are not changed during simulation. But the solution vector (the vector containing the terminal voltages for each instance) changes during the simulation. Solution vector is calculated from engine/solver based on model evaluation results. Before each model evaluation in the GPU, the CPU packs the updated solution vector into the format shown in FIG. 2F and transfers the packed data to into GPU. For each instance, the instance data stored in FIG. 2B includes the terminal indices which are the indices to the solution vector. The indices are used by the GPU to retrieve the terminal voltages for that instance. Using the instance parameters, the GPU retrieves the terminal indices. From the terminal indices and the solution vector, the GPU retrieves the terminal voltages for each instance. After evaluation, model outputs are packed by the GPU in manner similar to that shown in the data structure of FIG. 2B.

If the model evaluation code is relatively long, it is possible to exceed the code (shader) length in the GPU. Furthermore, a code that is longer than a limit, may result in poor performance due to the length of the shader. In accordance with one embodiment, to overcome such shortcomings, the model evaluation is divided into a number of parts, where each kernel is assigned to one such part. For example, in one embodiment, the model evaluation is divided into 3 parts, namely a current-voltage model evaluation part, capacitance-voltage model evaluation part, and junction evaluation part.

Figure 3A:
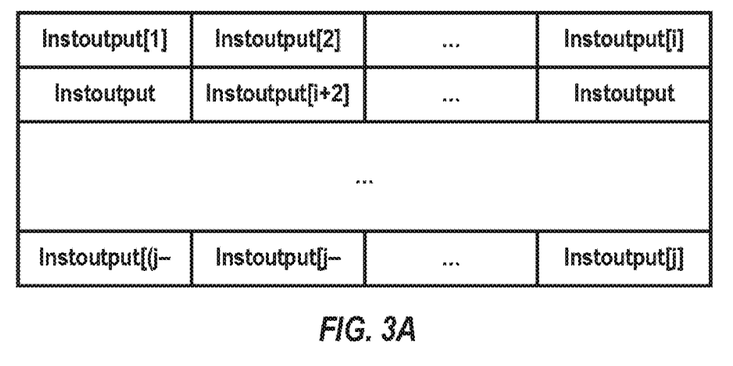
FIGS. 3A-3C show the format of the data used by the GPU before and after the stamping process, in accordance with one embodiment of the present invention.
Figure 3B:
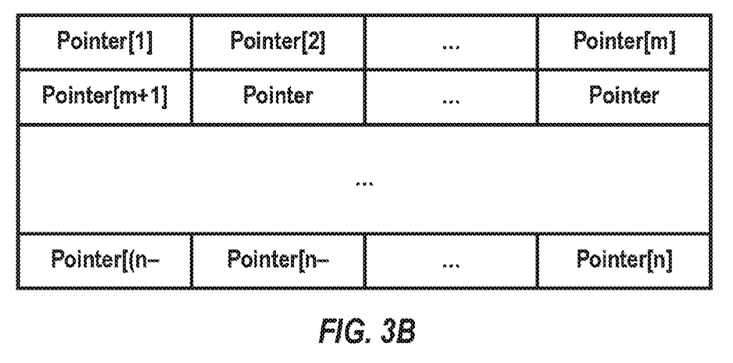

To stamp the data in the GPU, output data of model evaluation is converted from instance based format to a matrix pointer based format. FIGS. 3A and 3B show the data format before and after the stamping process, respectively. Because the data size after the stamping process is typically smaller than that before the stamping, the data size to be transferred to CPU from GPU is reduced, thereby increasing the performance of data transfer.

FIG. 3A shows an exemplary data structure associated with the output of the model evaluation based on the instance data and before the stamping. This data has the same structure as the link entries shown in FIG. 2D. FIG. 3B shows the data structure of matrix pointers obtained from FIG. 3A after the stamping. Data in FIG. 3B are organized according to matrix pointer sequence of the matrix to be solved by simulator solver. Each entry in the data shown in FIG. 3B corresponds to one pointer of the matrix in the simulator. To effectuate the stamping, each data in FIG. 3A is added to a position in FIG. 3B. Because, in accordance with the stamping technique, multiple data associated with the structure in FIG. 3A are added together into a single entry associated with the structure in FIG. 3B, the size of the data after the stamping is often smaller than the size of the data before the stamping operation is performed.

Figure 4A:
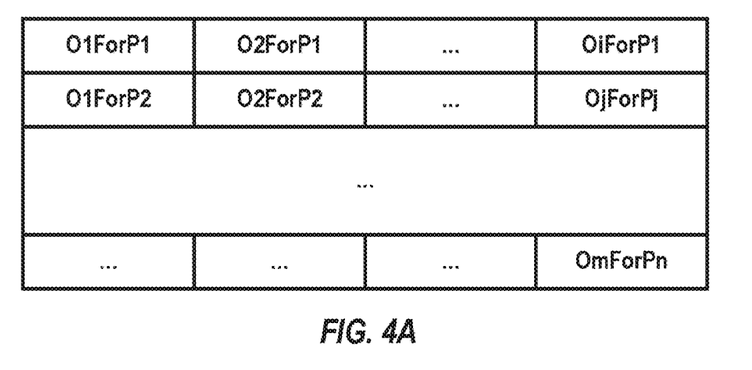
FIGS. 4A-4C show the data structure of the pointer to model output map as used by the GPU, in accordance with one embodiment of the present invention.
Figure 4B:
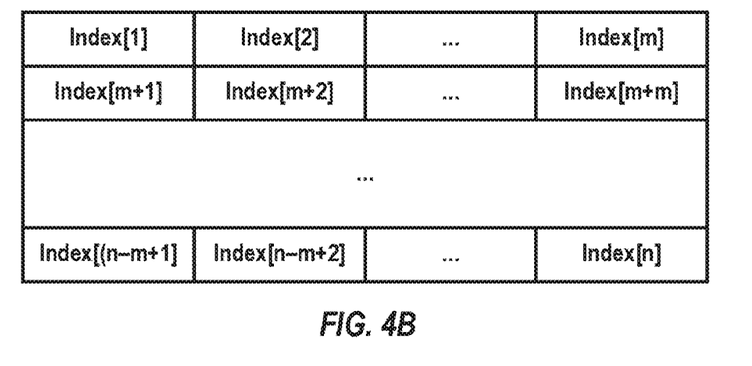
Figure 4C:
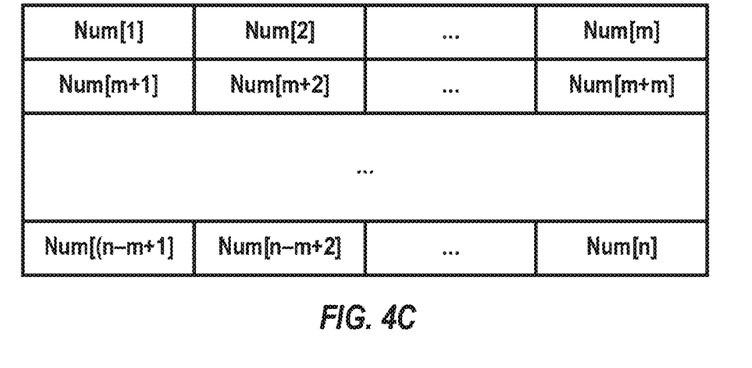

In order to perform stamping, a pointer to model output map is setup before the model evaluation and transfer of the data from the CPU to GPU. A map is used herein to refer to a link between two sets of data. Each model output shown in FIG. 3A is linked with (i.e., mapped to) one entry in FIG. 3B. It may also be possible that multiple data in FIG. 3A are linked to one location in FIG. 3B. The static data structure of the pointer to model output is not changed during simulation if the matrix structure is not changed. The data structure of the pointer to model output map is shown in FIGS. 4A through 4C. The matrix structure is often not changed during simulation. However, In a rare case, if during the simulation, the matrix structure is changed, then the data structure of the pointer to model output map is rebuilt to account for this change.

Figure 3C:
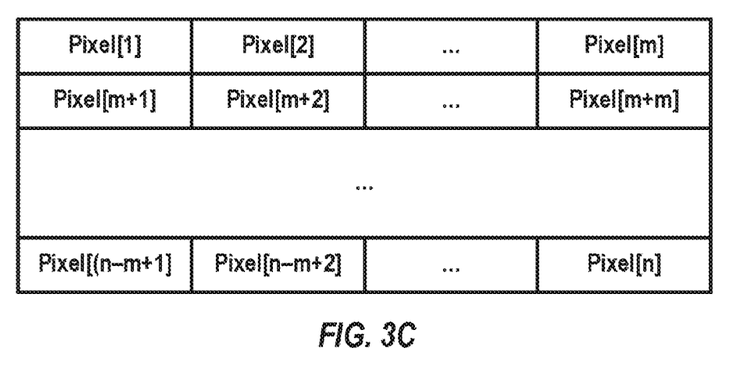

During the stamping process, a quad is drawn that has the same size as the number of entries shown in FIG. 4B, i.e., the number of matrix pointer to be stamped. Each matrix pointer is assigned to a thread. Each group of entries in FIG. 4A, points to a location in FIG. 3A associated with a matrix pointer in FIG. 3B. For example, entries O1ForP1 through O1ForP1, collectively define an index in FIG. 3A that are added together to collectively define the location for matrix pointer Pointer[1] of FIG. 3B. The pixels associated with the coordinates of the quad drawn by the GPU for stamping are supplied by the CPU to the GPU. FIG. 3C shows pixel coordinates of such a quad. These pixels have a one-to-one relation to the indices shown in FIG. 4B and with the same coordinates. The GPU assigns a thread to each pixel. The pixel coordinates are then used to locate the associated entries shown in FIG. 4B. The entries in FIG. 4B are subsequently used to locate the entries in FIGS. 4A and 4C.

Each entry in FIG. 4B is used as an index to define a pointer in FIG. 3B. The table shown in FIG. 4B thus has the same size as the table shown in FIG. 3B. The value of each entry in FIG. 4B is the starting point (the index) of a data entry in FIG. 4A for the associated matrix pointer in FIG. 3B. The number of entries in FIG. 4C is the same as the number of entries in FIG. 4B. Each entry in FIG. 4C represents the total data number of entries needed from a corresponding entry in FIG. 3A and that are to be added together to define a corresponding location in FIG. 3B. For example, Index[2] in FIG. 4B defines the location of O1ForP2 in FIG. 4A, that is the index of the first output to pointer map entry for pointer 2. From the value of Index[2], GPU can locate the first map information for pointer 2. Num [2] in FIG. 4C and determine how many output to pointer map entries are there for pointer 2. The GPU will then access total Num[2] entries in FIG. 4A to collect all the output to pointer map entries for pointer 2. From each map entry, GPU can locate the model evaluation output from FIG. 3A. Such a map entry is actually an index to one data stored in data shown in FIG. 3A. Accordingly, the entries in FIG. 4B and FIG. 4C have a one-to-one mapping relationship. The GPU uses the coordinates corresponding to each thread to locate and associate the various entries in FIGS. 4B and 4C. Using these entries, the GPU identifies the starting index and number of data for each matrix pointer. The index and number of data are thereafter used to locate the entries in FIG. 3A. The required entries in FIG. 3B are subsequently added to one another to define a corresponding location in FIG. 3B.

The data stamped in the GPU is thereafter transferred from the GPU to the CPU. The data received by the CPU is subsequently stamped into a matrix for further processing by the CPU.

Commercially available GPUs can only provide single precision floating point accuracy, which may not be good enough for circuit simulation. In accordance with the present invention, two techniques to this problem are provided. In accordance with the first technique, double precision emulation in GPU is carried out. To achieve this, a structure containing two single precision floating pointer numbers is generated to emulate a double precision floating point number. In such a structure, one floating point number contains the major digits of the double precision number, and the other floating point number contains the minor digits of the double precision number. Different techniques may then be used to accomplish double precision accuracy using this data structure for operations, such as addition, subtraction, multiplication and square root operations.

For example, the following steps are included in the addition operation:
1. Two major parts are added to be the major part of the output
2. Minor part of the output is obtained by subtracting the major part of a larger input from the major part of the output
3. Minor part of the output is further modified by subtracting the major part of the smaller input by the minor part of the output
4. Minor part of the output is further modified by adding of the minor parts of the two input In accordance with the second technique. to remedy the problem that commercially available GPUs can only provide single precision floating point, switching between the GPU model with single precision and the CPU model with double precision during is performed during the simulation. A CPU model with double precision accuracy determines when and when not to call GPU model evaluation based on the iteration information provided in engine during each Newton step. In the first few iterations, the GPU model is called to evaluation and improve performance. Then after a certain number of iterations, a switch is made to CPU double precision model evaluation routine to improve accuracy.

Figure 5:
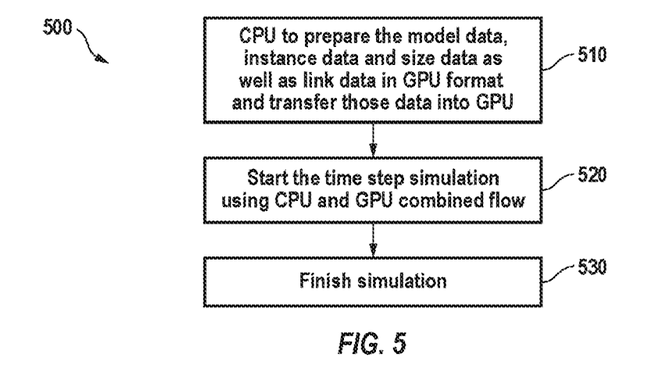
FIG. 5 is a flowchart of steps carried to perform model evaluation, circuit simulation and/or design verification, in accordance with one exemplary embodiment.

FIG. 5 is a flowchart 500 of steps carried to perform model evaluation, circuit simulation and/or design verification, in accordance with one exemplary embodiment. In step 500, a CPU prepares model data, instance data, size data as well as link data in a format suitable by a GPU and transfers this data to the GPU. In step 510, the activities of the CPU and GPU coordinated and combined to carry out the simulation. Simulation ends in step 530.

Figure 6:
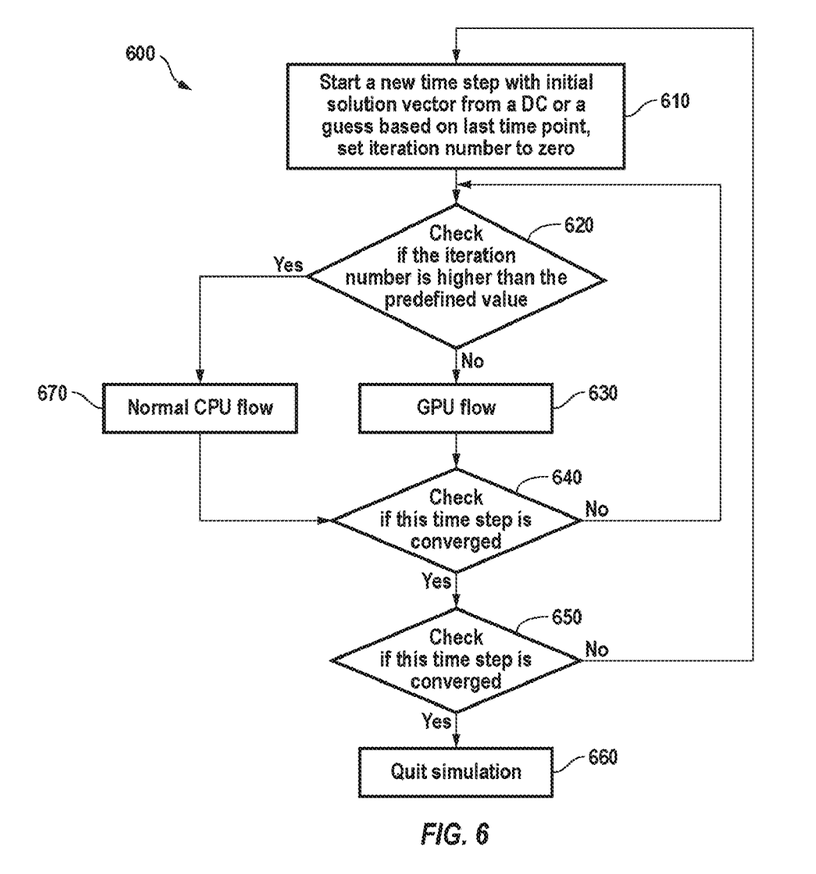
FIG. 6 is a flowchart of steps performed by the CPU and the GPU for a time step during model evaluation, circuit simulation and/or design verification, in accordance with one exemplary embodiment.

FIG. 6 is a flowchart 600 of steps performed by the CPU and the GPU for a time step during model evaluation, circuit simulation and/or design verification, in accordance with one exemplary embodiment. At step 610, a new time step is started with an initial solution vector from a DC or an estimate based on the last time point; the iteration number is also set to zero. If at step 620 it is determined that the iteration number is higher than a predefined value, the evaluation/simulation/verification flow (hereinafter flow) is passed 670 to the CPU which continue to advance the flow. If the time step is detected as converging in steps 640 and 650, the time step simulation is completed 660. If the time step is detected as not converging in step 650, the flow returns to step 620. If at step 620 it is determined that the iteration number is smaller than a predefined value, the flow of the evaluation/simulation/verification is passed 620 to GPU 630. Thereafter, the GPU continues to compute and proceed with the flow of the evaluation/simulation/verification, at which the process moves to step 640, as shown in flowchart 600 and shown in FIG. 6.

Figure 7:
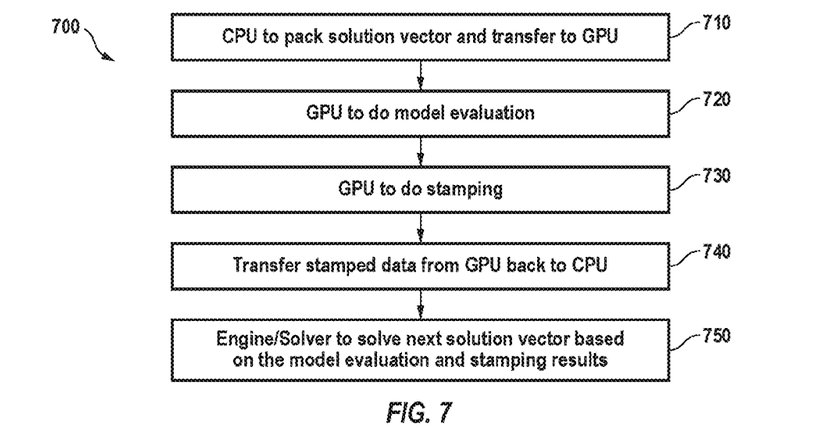
FIG. 7 is a flowchart of steps performed by the GPU for each time step, in accordance with one exemplary embodiment. of the present invention.

FIG. 7 is a flowchart 700 of steps performed by the GPU for each time step. In step 710, the CPU packs the solution vector and transfers it to the GPU. In step 720, the GPU performs the model evaluation. In step 730, the GPU performs stamping. In step 740, the GPU transfers the stamped data back to the CPU. In step 750, an engine/solver solves the next solution vector based on the model evaluation and stamping results.

Figure 8:
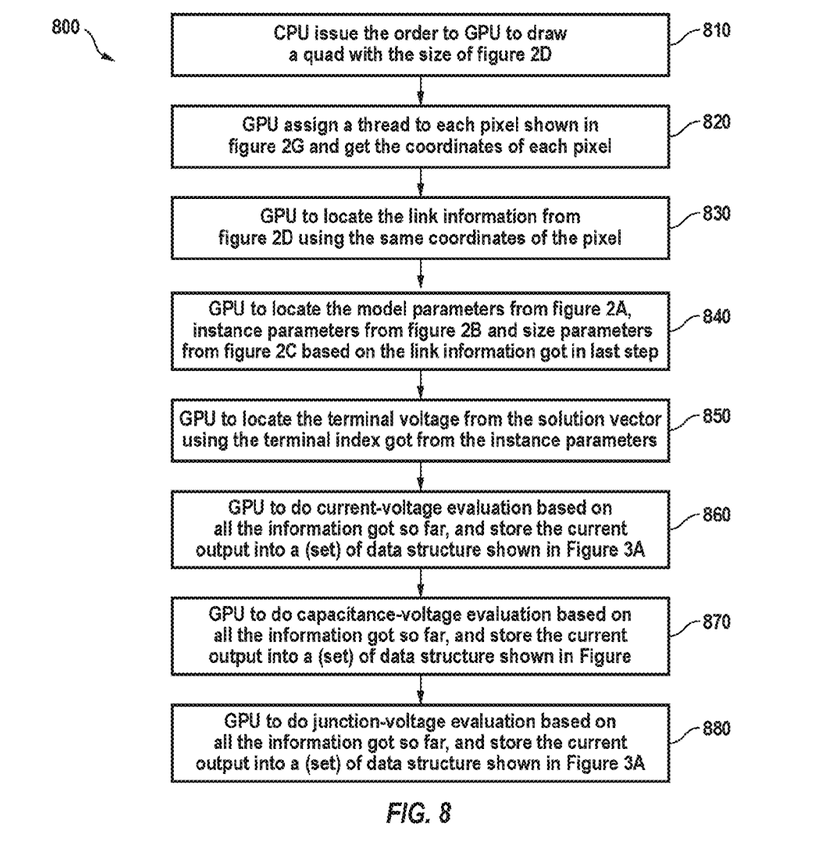
FIG. 8 is a flowchart of steps performed by the GPU during model evaluation, in accordance with one exemplary embodiment of the present invention.

FIG. 8 is a flowchart 800 of steps performed by the GPU during model evaluation. At step 810, the CPU issue an instruction to the GPU to draw a quad having a specified size. In step 820, the GPU assigns a thread to each pixel in the drawn quad, and retrieves the coordinates of the pixels. In step 830, the GPU locates the link data using the pixel coordinates of the pixel. In step 840, the GPU to locate the model parameters, instance parameters and size parameters using the located link information. In step 850, GPU locates the terminal voltages from the solution vector using the terminal indices obtained from the instance parameters. In step 860, the GPU performs current-voltage evaluation using the available data and stores the result of its computations. In step 870, the GPU performs capacitance-voltage evaluation using the available data, and stores the result of its computations. In step 880, the GPU performs junction-voltage evaluations using the available data and store the results.

Figure 9:
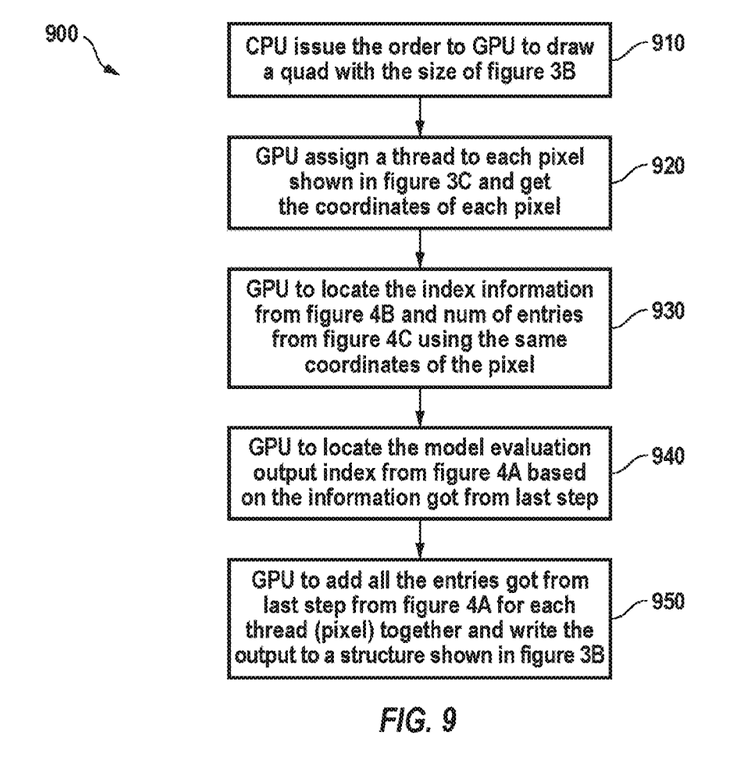
FIG. 9 is a flowchart of steps performed by the GPU to stamp data, in accordance with one exemplary embodiment of the present invention.

FIG. 9 is a flowchart 900 of steps performed by the GPU to stamp data. In step 910, the CPU issues an instruction to the GPU to draw a quad having a specified size. In step 920, the GPU assigns a thread to each pixel in the drawn quad, shown in FIG. 2G 3C and retrieves the coordinates of the pixels. In step 930, the GPU locates the link data, the number of related stored using the pixel coordinates. In step 940, the GPU locates the model evaluation output index using the results of the operation of step 930. In step 940, the GPU adds the entries obtained in step 940 for each thread (pixel) together and stored the results of this operation.

Figure 10:
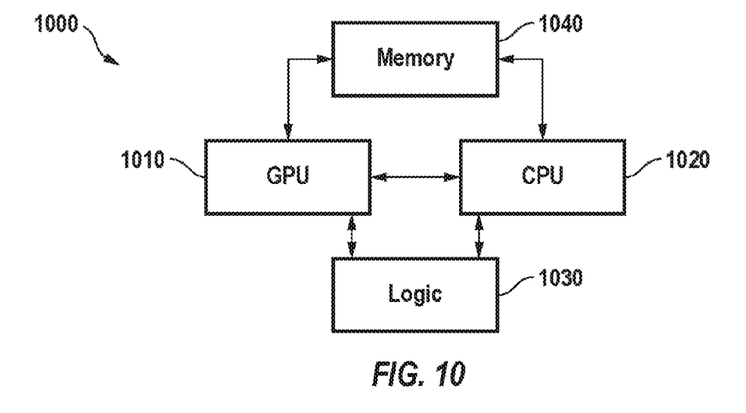
FIG. 10 is a block diagram of a computer system adapted to perform model evaluation, in accordance with one exemplary embodiment of the present invention.

FIG. 10 is a block diagram of a computer system 1000 adapted to perform model evaluation, in accordance with one embodiment of the present invention. Computer system 1000 is shown as including a GPU 1010, a CPU 1020, a memory 1030, and a logic block 1030. Memory 1040 stores data used by GPU 1010 and CPU 1020. Logic block 1030 performs logic operations as required by GPU 1010 and CPU 1020

The above embodiments of the present invention are illustrative and not limiting. Various alternatives and equivalents are possible. The invention is not limited by the type of CPU or GPU used during the design/simulation. The invention is not limited by the type of circuit that may be designed/simulated using the present invention. Other additions, subtractions or modifications are obvious in view of the present disclosure and are intended to fall within the scope of the appended claims.

What is claimed is:

1. A method of performing model evaluation in a graphical processing unit (GPU), said model evaluation being performed during a design or verification of an integrated circuit, the method comprising:
   storing a plurality of first texture data corresponding to device size parameters of devices of the integrated circuit;
   storing a plurality of second texture data corresponding to instance parameters of the devices;
   storing a plurality of third texture data corresponding to models of the devices;
   storing a plurality of fourth texture data corresponding to terminal voltages received by the devices;
   storing a plurality of links linking each device instance to an associated device model, size parameters and instance parameters;
   drawing a quad in the GPU having a size defined by the number of the plurality of links;
   assigning each thread in the quad to a different one of the plurality of links; and
   carrying out computations in each thread using the linked data to perform the model evaluation.

2. The method of claim 1 further comprising:
   receiving the first, second, third and fourth plurality of texture data from a central processing unit (CPU).

3. The method of claim 2 further comprising:
stamping output data computed by the GPU.

4. The method of claim 3 wherein the output data has a format defined by device instances, said stamping of the data further comprises:
converting the output data of the GPU from a device instance based format to a matrix pointer based format.

5. The method of claim 4 further comprising:
transferring the stamped data to the CPU.

6. The method of claim 4 further comprising:
performing double precision emulation in the GPU to achieve double precision floating point accuracy.

7. The method of claim 4 further comprising:
switching operation between the GPU and the CPU to achieve double precision floating point accuracy.

8. The method of claim 2 further comprising:
dividing the model evaluation into a plurality of model evaluation parts to avoid GPU shader length limit; and
assigning each model evaluation part to a different GPU kernel.

9. The method of claim 8 wherein said plurality of model evaluation parts comprises current-voltage model evaluation part, capacitance-voltage model evaluation part, and junction evaluation part.

10. A system adapted to perform model evaluation during a design or verification of an integrated circuit, the system comprising a central processing unit (CPU) and a graphical processing unit (GPU), wherein the CPU is adapted to:
store a plurality of first texture data corresponding to device size parameters of the integrated circuit;
store a plurality of second texture data corresponding to device instance parameters;
store a plurality of third texture data corresponding to models of the devices;
store a plurality of fourth texture data corresponding to terminal voltages received by the devices; and
store a plurality of links linking each device instance to an associated device model, size parameters and instance parameters;
wherein the GPU is adapted to:
draw a quad having a size defined by the number of the plurality of links;
assign each thread in the quad to a different one of the plurality of links; and
carry out computations in each thread using the linked data to perform the model evaluation.

11. The system of claim 10 wherein said GPU is further adapted to stamp its output data.

12. The system of claim 11 wherein the GPU output data has a format defined by the device instances, wherein to stamping its output data, the GPU is further adapted to convert its output data from a device instance based format to a matrix pointer based format.

13. The system of claim 12 wherein said GPU is further adapted to transfer the stamped data to the CPU.

14. The system of claim 13 wherein said GPU is further adapted to perform double precision emulation to achieve double precision floating point accuracy.

15. The system of claim 13 further comprising a control logic adapted to switch model evaluation operation between the GPU and the CPU to achieve double precision floating point accuracy.

16. The system of claim 10 wherein said GPU is further adapted to divide the model evaluation operation into a plurality of model evaluation parts so as to avoid GPU shader length limit and to assign each model evaluation part to a different one of the GPU kernels.

17. The system of claim 16 wherein said plurality of model evaluation parts comprises current-voltage model evaluation part, capacitance-voltage model evaluation part, and junction evaluation part.

* * * * *